(12) United States Patent
Park et al.

(10) Patent No.: US 7,804,875 B2
(45) Date of Patent: Sep. 28, 2010

(54) VERTICAL CAVITY SURFACE EMITTING LASER MODULE HAVING MONITORING PHOTODIODE AND METHOD OF FABRICATING THE SAME

(75) Inventors: Mi Ran Park, Daejeon (KR); O Kyun Kwon, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 11/635,938

(22) Filed: Dec. 8, 2006

(65) Prior Publication Data
US 2007/0133642 A1    Jun. 14, 2007

(30) Foreign Application Priority Data
Dec. 8, 2005  (KR) .................. 10-2005-0120082
Jun. 30, 2006 (KR) .................. 10-2006-0060501

(51) Int. Cl.
*H01S 5/026* (2006.01)
*H01S 5/183* (2006.01)

(52) U.S. Cl. ................ 372/50.21; 372/50.1; 372/50.124

(58) Field of Classification Search ............. 372/50.21, 372/50.1, 50.124
See application file for complete search history.

(56) References Cited

U.S. PATENT DOCUMENTS

| | | | |
|---|---|---|---|
| 5,726,462 A * | 3/1998 | Spahn et al. ................. 257/76 |
| 5,799,030 A * | 8/1998 | Brenner ..................... 372/50.21 |
| 6,001,664 A * | 12/1999 | Swirhun et al. ............... 438/31 |
| 6,678,292 B2 | 1/2004 | Wickstrom et al. |
| 6,882,673 B1 * | 4/2005 | Wasserbauer et al. ...... 372/50.1 |
| 7,016,392 B2 * | 3/2006 | Tandon et al. ................. 372/96 |
| 7,160,038 B2 * | 1/2007 | Kwak et al. .................. 385/93 |
| 2002/0126963 A1 | 9/2002 | Burmeister |
| 2004/0066816 A1 * | 4/2004 | Collins et al. ................. 372/44 |
| 2004/0180460 A1 * | 9/2004 | Chirovsky et al. ............ 438/39 |
| 2005/0063437 A1 * | 3/2005 | Horng et al. .................. 372/44 |

* cited by examiner

*Primary Examiner*—Minsun Harvey
*Assistant Examiner*—Michael Carter
(74) *Attorney, Agent, or Firm*—Ladas & Parry LLP

(57) ABSTRACT

Provided are a vertical cavity surface emitting laser (VCSEL) module providing accurate alignment between a VCSEL and a monitoring photodiode (MPD) for efficiently detecting light emitted by the VCSEL and a method of fabricating the VCSEL module. The VCSEL module includes: a first mirror layer, a first semiconductor conducting layer, an active layer, a tunnel junction layer, and a second semiconductor conducting layer sequentially formed on a first region in a substrate having first and second regions; a MPD disposed on a portion of the second semiconductor conducting layer in the first region; and a VCSEL including layers having the same shapes as the first mirror layer, the first semiconductor conducting layer, the active layer, the tunnel junction layer and the second semiconductor conducting layer in the first region, and a second mirror layer formed on a portion of the second semiconductor conducting layer, and sequentially formed on the second region in the substrate. The predetermined distance is set so that light emitted by the VCSEL can be detected by the MPD.

12 Claims, 2 Drawing Sheets

VERTICAL CAVITY SURFACE EMITTING LASER MODULE HAVING MONITORING PHOTODIODE AND METHOD OF FABRICATING THE SAME

CROSS-REFERENCE TO RELATED PATENT APPLICATION

This application claims the benefit of Korean Patent Application No. 10-2005-0120082 filed on Dec. 8, 2005 and Korean Patent Application No. 10-2006-0060501 filed on Jun. 30, 2006, in the Korean Intellectual Property Office, the disclosures of which are incorporated herein in their entirety by reference.

BACKGROUND OF THE INVENTION

1. Field of the Invention

The present invention relates to a semiconductor laser and a method of fabricating the same, and more particularly, to a vertical cavity surface emitting laser (VCSEL) module having a monitoring photodiode (MPD) and a method of fabricating the same.

2. Description of the Related Art

Vertical cavity surface emitting lasers (VCSELs) have a high coupling efficiency due to a low threshold current and a circular beam shape compared to traditional edge-emitting laser diodes. Also, VCSELs can easily be made into two-dimensional arrays and be tested at the wafer level, thus enabling high volume production at low costs comparable to traditional electronic devices. Thus, VCSELs are emerging as promising alternatives to conventional optical devices for use in optical communication networks and optical sensors. Much research is being focused toward the development of low-priced modules using VCSELs.

A VCSEL is typically coupled to a monitoring photodiode (MPD) such as a positive-intrinsic-negative (PIN)-PD for monitoring the output power of the laser and controlling the output power based on the monitored output power. In this case, it is difficult to achieve low-cost coupling between the VCSEL and the MPD. That is, because a VCSEL emits light perpendicular to the surface of a substrate, it is not easy to monolithically integrate a MPD with the VCSEL so as to detect light. For the monolithic integration of a MPD with a VCSEL, the MPD may be attached to the bottom surface of the VCSEL using wafer fusion or a metallic bonding. Another method is to monolithically grow the layers of the MPD and the VCSEL on a substrate and couple the MPD to a side or bottom of the VCSEL using a device fabrication process.

Of the above methods, wafer fusion may degrade device reliability and manufacturing yield due to defects in fusion that may occur during fabrication process, thus increasing the manufacturing costs. Wafer fusion also causes a voltage drop at a fused interface, thus resulting in increased input voltage.

If a MPD is coupled to a side of a VCSEL, the MPD cannot accurately monitor only the output power of the VCSEL because it detects both spontaneous emission and the output power of the VCSEL. When a MPD is coupled to a bottom surface of a VCSEL, the MPD cannot effectively detect the output power of the VCSEL due to the absorption of the laser beam into the substrate.

Various alternatives for coupling a MPD with a VCSEL using TO-can package have been proposed. However, use of a TO-can package requires accurate alignment between the MPD and the VCSEL in order to efficiently detect light emitted from the VCSEL. This necessarily leads to an increase in the price of the VCSEL modules.

SUMMARY OF THE INVENTION

The present invention provides a vertical cavity surface emitting laser (VCSEL) module having a VCSEL integrated with a monitoring photodiode (MPD) for efficiently detecting light emitted by the VCSEL, which can be fabricated using a simple process and provides accurate alignment between the MPD and the VCSEL.

The present invention also provides a method of fabricating a VCSEL module in which a MPD and a VCSEL are monolithically integrated by consecutively growing a VCSEL layer and a MPD layer on a semiconductor substrate.

According to an aspect of the present invention, there is provided a VCSEL module having a MPD, including: a substrate having first and second regions spaced apart a predetermined distance; a first mirror layer, a first semiconductor conducting layer, an active layer, a tunnel junction layer, and a second semiconductor conducting layer sequentially formed on the first region in the substrate; a MPD disposed on a part of the second semiconductor conducting layer in the first region; and a VCSEL having layers having the same shapes as the first mirror layer, the first semiconductor conducting layer, the active layer, the tunnel junction layer and the second semiconductor conducting layer in the first region and sequentially formed on the second region in the substrate. The predetermined distance is set so that light emitted by the VCSEL can be detected by the monitoring photodiode.

According to another aspect of the present invention, there is provided a method of fabricating a VCSEL module having a MPD. According to the method, a first mirror layer, a first semiconductor conducting layer, an active layer, a second semiconductor conducting layer, a tunnel junction layer, and another second semiconductor conducting layer, an n-doped layer, an undoped layer, and a p-doped layer are sequentially formed on a semiconductor substrate. A MPD is then formed by etching a MPD layer, i.e., the n-doped layer, the undoped layer, and the p-doped layer so as to form a MPD on only a portion of the first region to match an angle at which output power of the VCSEL is incident on the stacked layers. Subsequently, a VCSEL is formed by etching the second semiconductor conducting layer, the tunnel junction layer, and the active layer in the second region. In this manner, the resulting stacked structure is separated into the first and second regions.

After the etching, the method may further include forming a third metal electrode layer on a portion of the second semiconductor conducting layer so as to expose a central portion of the second semiconductor conducting layer in the second region and forming a fourth metal electrode layer on an exposed portion of the first semiconductor conducting layer; and depositing a second mirror layer on the exposed portion of the second semiconductor conducting layer.

The present invention provides a VCSEL module having a VCSEL integrated with a MPD that allows accurate alignment between the MPD and VCSEL and efficient light detection. To achieve the purpose of the present invention, the MPD and the VCSEL are formed on different regions in the same substrate. A MPD layer can be additionally deposited and etched to form a MPD during the process of fabricating the VCSEL. That is, the process of fabricating the MPD is added to the process of fabricating the VCSEL.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1A:
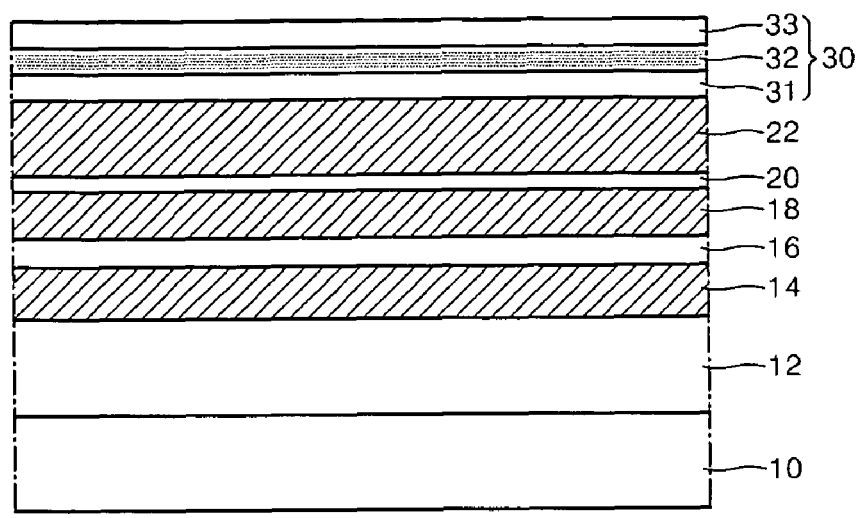
FIGS. 1A and 1B are cross-sectional views illustrating a method of fabricating a vertical cavity surface emitting laser (VCSEL) device having a monitoring photodiode (MPD) according to an embodiment of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Like reference numerals in the drawings denote like elements.

Figure 1B:
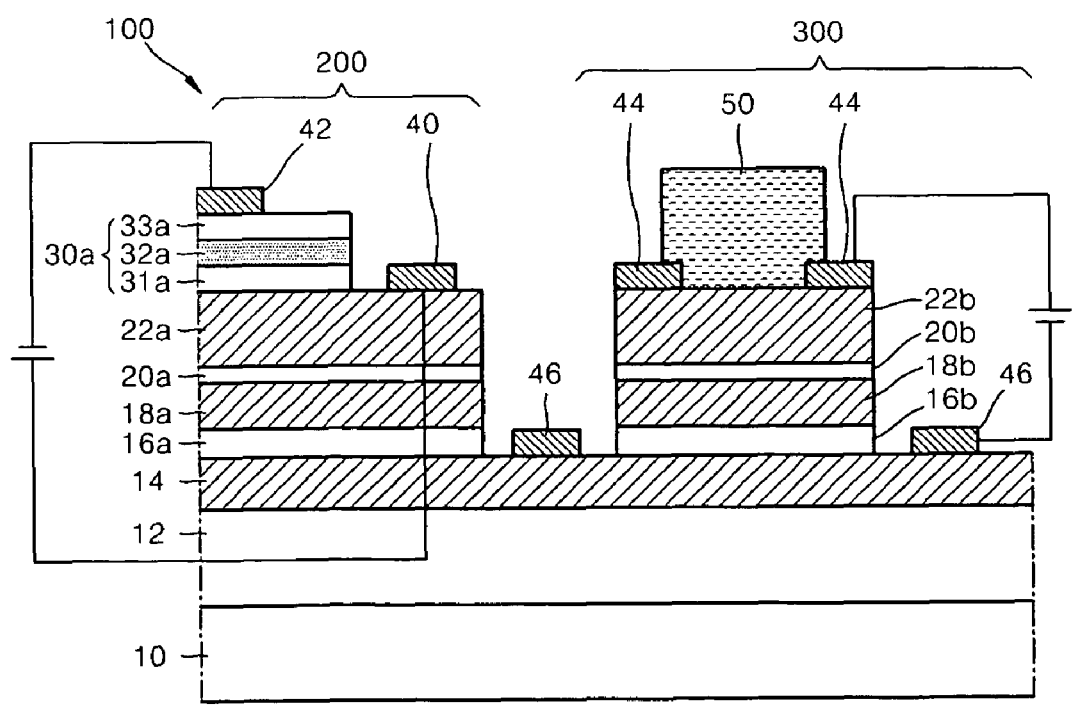

FIGS. 1A and 1B are cross-sectional views illustrating a method of fabricating a vertical cavity surface emitting laser (VCSEL) device 100 having a monitoring photodiode (MPD) according to an embodiment of the present invention.

Referring to FIG. 1A, a first mirror layer 12, a first semiconductor conducting layer 14, an active layer 16, a second semiconductor conducting layer 18, and a tunnel junction layer 20, and another second semiconductor conducting layer 22 are sequentially grown on a substrate 10 using a compound semiconductor epitaxial growth technique. The first and second semiconductor conducting layers 14, 18, and 22 acting as a conducting layer for injecting current may be made of a semiconductor material that dissipates heat due to its excellent thermal characteristics. The tunnel junction layer 20 defines a region into which current is injected by confining current. The active layer 16 is a gain layer that plays an essential role in laser operation. In one embodiment, the substrate 10 and the first mirror layer 12 may be formed of InP and InAlGaAs/InAlAs, respectively. The first and second semiconductor conducting layers 14, 18, and 22 may be formed of n-InP, p-InP, and n-InP, respectively. The active layer 16 may have a multi-quantum well (MQW) structure composed of InAlGaAs. In this manner, an epitaxial structure of the VCSEL device 100 is completed except for a second mirror layer 50 in FIG. 1B that will be subsequently formed.

Subsequently, an n-doped layer 31, an undoped light absorption layer 32, and a p-doped layer 33 are sequentially grown on the second semiconductor conducting layer 22 using an epitaxial growth technique. For example, the n-doped layer 31, the light absorption layer 32, and the p-doped layer 33 may be formed of n-InAlGaAs, i-InGaAs, and p-InAlGaAs, respectively. That is, an epitaxial structure for a MPD is a positive-intrinsic-negative (PIN) structure.

Referring to FIG. 1B, the VCSEL device 100 with a MPD, which includes a first region 200 having a MPD layer 30a and a second region 300 having a VCSEL, is formed using a typical semiconductor fabrication process including photolithography, etching, and deposition. The first region 200 is positioned on the first semiconductor conducting layer 14 and is separated from the second region 300 by a predetermined distance. The first and second regions 200 and 300 are electrically insulated from each other by an insulating layer (not shown). The active layer 16, the second semiconductor conducting layers 18 and 22, and the tunnel junction layer 20 in FIG. 1A are respectively separated into two parts in the first and second regions 200 and 300, i.e., active layers 16a and 16b, second semiconductor conducting layers 18a and 22a and 18b and 22b, and tunnel junction layers 20a and 20b. In this manner, the first and second regions 200 and 300 can be simply formed using a typical VCSEL fabrication process. Thus, the VCSEL device 100 can be fabricated more simply than using a conventional method whereby a VCSEL and a MPD are independently integrated.

The MPD layer 30a is formed on the second semiconductor conducting layer 22a in the first region 200. More specifically, the MPD layer 30a with a PIN structure is formed by etching the PIN epitaxial structure of FIG. 1A so that the MPD layer 30a is formed on only a portion of the second semiconductor conducting layer 22a in the first region 200. Current for driving the first region 200 serving as the MPD is injected through a first metal electrode layer 40 formed on the second semiconductor conducting layer 22a and the a second metal electrode layer 42 formed on MPD layer 30a. A third metal electrode layer 44 is formed on either side of the second semiconductor conducting layer 22b in the second region 300 serving as a VCSEL so as to expose a central portion of the second semiconductor conducting layer 22b. Then, a fourth metal electrode layer 46 is formed on a portion of the first semiconductor conducting layer 14 exposed by etching the active layer 16b, the tunnel junction layer 20b, and the second semiconductor conducting layers 18b and 22b. The output power of the VCSEL is emitted perpendicular to the substrate 10 in an upward direction. The second mirror layer 50 is deposited on a portion of the second semiconductor conducting layer 22b on which the third metal electrode layer 44 has not been formed. For example, the second mirror layer 50 may be formed by depositing 6 and half pairs of dielectric materials of $TiO_2/SiO_2$. Current for driving the laser is injected through the third metal electrode layer 44 on the second semiconductor conducting layer 22b and the fourth metal electrode layer 46 on the first semiconductor conducting layer 14. Further, an air-gap is formed on both sides of the tunnel junction layer 20b by selective wet etching and serves to confine current.

Figure 2:
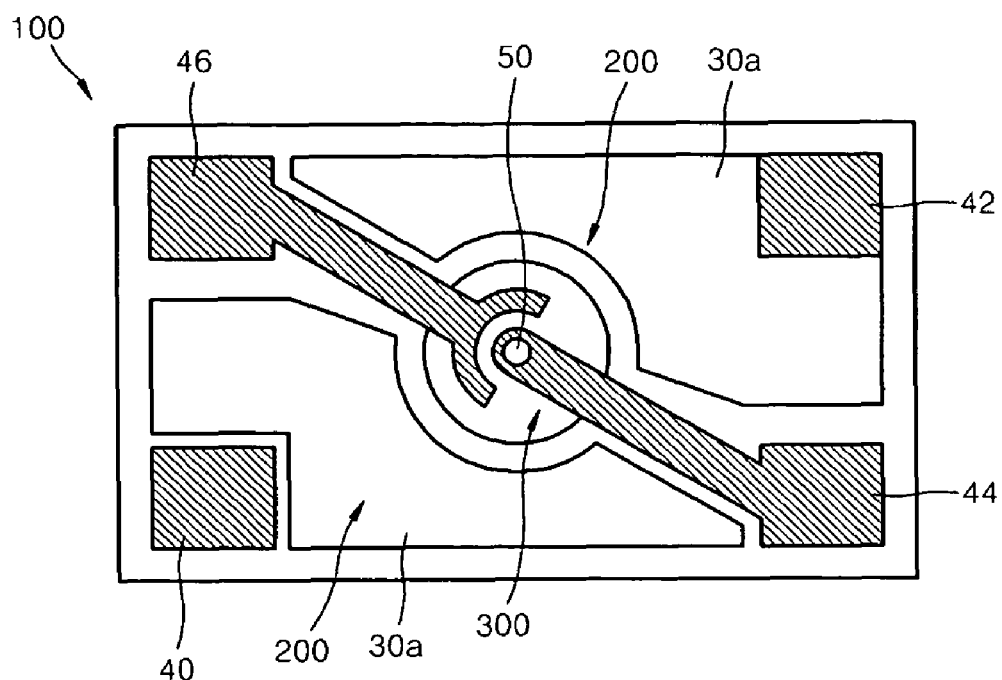
FIG. 2 is a plan view illustrating a unit structure for a VCSEL device having a VCSEL monolithically integrated with a MPD according to an embodiment of the present invention.

FIG. 2 is a plan view illustrating a unit structure for a VCSEL device 100 having a VCSEL monolithically integrated with a MPD according to an embodiment of the present invention. Referring to FIG. 2, the unit structure for the VCSEL device 100 having a VCSEL integrated with the MPD is divided into a second region 300 and a first region 200 surrounding the second region 300. The first region 200 is electrically insulated from the second region 300 by an insulating layer (not shown). The VCSEL device 100 may have various other configurations.

Figure 3:
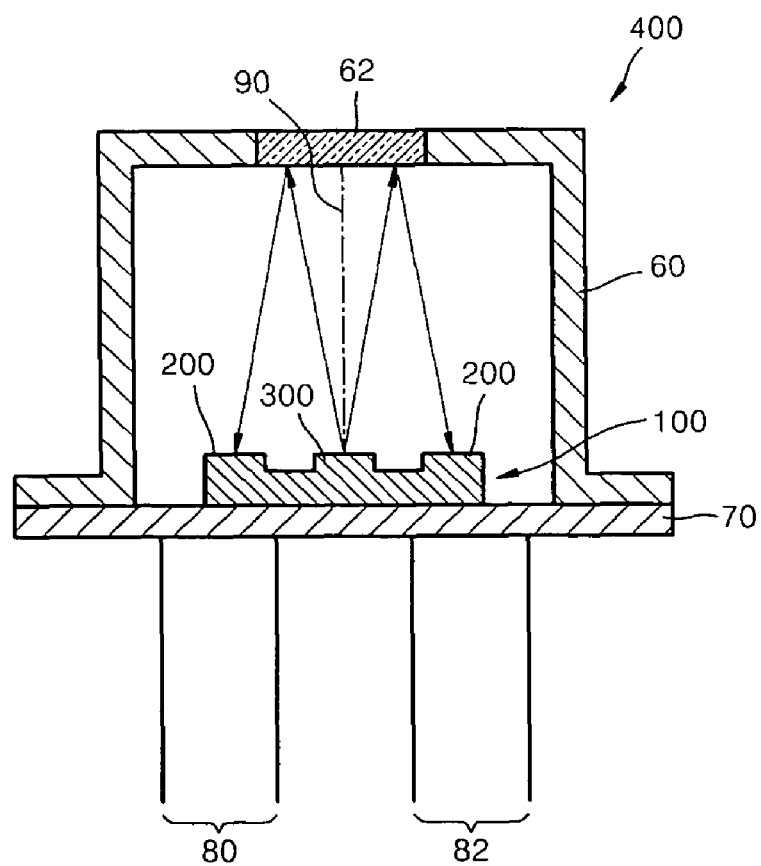
FIG. 3 is a cross-sectional view illustrating TO-module in which a VCSEL integrated with a MPD is packaged, according to an embodiment of the present invention.

FIG. 3 is a cross-sectional view illustrating TO-module in which a VCSEL module 400 in which a VCSEL chip 100 having a VCSEL 300 is integrated with a MPD is packaged, according to an embodiment of the present invention.

Referring to FIG. 3, the VCSEL chip 100 including a second region 300 having a single VCSEL and a first region 200 having a single MPD is assembled on a substrate 70 within the TO can and is covered by a TO-cap 60 equipped with an optical lens 62. A portion of light emitted from the second region 300 in an upward direction is reflected by the optical lens 62 and detected by the first region 200.

Because the reflected light travels at a predetermined angle to an axis 90 perpendicular to the second region 300, it is necessary to accurately align the VCSEL with the MPD. Unlike a conventional VCSEL device, the present invention eliminates the need for a separate step for alignment between the VCSEL and the MPD during packaging because the VCSEL and the MPD are fabricated on a predetermined semiconductor substrate to match the angle of light being incident on the MPD. In this manner, the VCSEL module 400 of according to the current embodiment of the present invention ensures accurate alignment between the MPD and the VCSEL. Current is injected into a pin 80 connected to third and fourth metal electrodes (44 and 46 in FIG. 1B) in the second region 300 and a signal is detected through a pin 82 of the TO-can connected to first and second metal electrodes (40 and 42) in the first region 200. In this manner, the output power of the VCSEL can be detected.

A VCSEL device according to the present invention having a VCSEL monolithically integrated with a MPD can be fabricated simply by using a typical VCSEL fabrication process instead of independently integrating the VCSEL and the MPD. Further, the present invention does not require a separate step for alignment with the MPD during packaging, thus achieving a low-priced VCSEL module.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A Vertical Cavity Surface Emitting Laser (VCSEL) module having a monitoring photodiode, the VCSEL module comprising:
   a substrate having first and second regions spaced apart by a predetermined distance;
   a monitoring photodiode disposed on a first mirror layer, a first semiconductor conducting layer, an active layer, a lower second semiconductor conducting layer, a tunnel junction layer, and directly disposed on an upper second semiconductor conducting layer in which the layers are sequentially formed on each other in the first region; and
   a VCSEL disposed on the first mirror layer, the first semiconductor conducting layer, the active layer, the lower second semiconductor conducting layer, the tunnel junction layer, and the upper second semiconductor conducting layer sequentially formed on each other in the second region of the substrate, wherein the VCSEL comprises the first mirror layer, the first semiconductor conducting layer, the active layer, the lower second semiconductor conducting layer, the tunnel junction layer, the upper second semiconductor conducting layer and a second mirror formed in the second region, wherein each of the first semiconductor conducting layer, the active layer, the lower second semiconductor conducting layer, the tunnel junction layer, and the upper second semiconductor conducting layer in the second region has a thickness which is substantially the same as the thickness of the corresponding layer in the first region; and
   a third metal layer formed to cover a portion of the upper second semiconductor conducting layer and exposing a central portion of the upper second semiconductor conducting layer in the second region,
   wherein the second mirror layer formed on the exposed portion of the upper second semiconductor conducting layer and on an upper portion of the third metal layer and emitting light of the VCSEL,
   wherein the second mirror layer is formed only on the upper second semiconductor conducting layer in the second region, and
   wherein the predetermined distance is set so that light emitted by the VCSEL formed in the second region of the substrate can be detected by the monitoring photodiode formed in the first region of the substrate.

2. The VCSEL module of claim 1, wherein the monitoring photodiode is formed of a Positive-Intrinsic-Negative (PIN) semiconductor material.

3. The VCSEL module of claim 1, wherein in the second region:
   the first mirror layer is formed on the substrate;
   the first semiconductor conducting layer is formed on the first mirror layer and injects current into the VCSEL;
   the active layer is formed on the first semiconductor conducting layer;
   the lower second semiconductor layer is disposed on the active layer to face the first semiconductor conducting layer and injects current, the tunnel junction layer is formed on the lower second semiconductor conducting layer and confines current, and the upper second semiconductor conducting layer is formed on the tunnel junction layer and injects current.

4. The VCSEL module of claim 1, wherein the first region surrounds the second region and is separated from the second region by an equal distance.

5. The VCSEL module of claim 1, further comprising:
   a first metal electrode layer formed on the upper second semiconductor conducting layer and adjacent to a lower portion of the monitoring photodiode; and
   the second metal electrode layer formed on the monitoring photodiode, to inject current into the monitoring photodiode.

6. The VCSEL module of claim 1, further comprising a cover with an optical lens disposed at a top portion of TO-can so as to reflect a portion of light emitted by the VCSEL for detection in the monitoring photodiode.

7. A method of fabricating a Vertical Cavity Surface Emitting Laser (VCSEL) module having a monitoring photodiode, the method comprising
   sequentially forming a first mirror layer, a first semiconductor conducting layer, a lower second semiconductor conducting region, an active layer, a tunnel junction layer, and an upper second semiconductor conducting layer, an n-doped layer, an undoped layer, and a p-doped layer on a semiconductor substrate;
   separating the resulting stacked structure into first and second regions to match the angle of light incident on the n-doped layer, the undoped layer, and the p-doped layer;
   forming an etch stop layer over the first region and etching away the n-doped layer, the undoped layer, and the p-doped layer from the second region and away from a portion of the first region so as to form a monitoring photodiode on only a portion of the upper second semiconductor conducting layer in the first region such that the upper second semiconductor conducting layer in the second region is exposed;
   forming a third metal electrode layer on a portion of the upper second semiconductor layer so as to expose a central portion of the upper second semiconductor conducting layer in the second region; and depositing a second mirror layer only on the portion of the upper second semiconductor conducting layer in the second region left exposed from the etching away of the n-doped layer, the undoped layer, and the p-doped layer in the second region, such that a VCSEL is formed in the second region, wherein the resulting stacked structure is separated into the first and second regions during the process of fabricating the VCSEL such that the monitoring photodiode is aligned with the VCSEL during the process of fabricating the VCSEL.

8. The method of claim 7, after the etching, further comprising forming an etch stop layer over the first region and etching the active layer, the lower second semiconductor conducting layer, the tunnel junction layer, and the upper second semiconductor conducting layer in the second region to expose a portion of the first semiconductor conducting layer in the second region.

9. The method of claim 8, after the etching, further comprising:
forming a fourth metal electrode layer on a portion of the exposed portion of the first semiconductor conducting layer between the monitoring photodiode and the VCSEL.

10. The method of claim 7, wherein the separating of the resulting stacked structure comprises:
positioning the first region so that it surrounds and is separated from the second region by an equal distance; and
electrically insulating the first region from the second region using an insulating layer.

11. The method of claim 7, wherein when depositing the second mirror layer, a portion of the second mirror layer is deposited on an upper portion of the third metal electrode layer.

12. The VCSEL module of claim 5, wherein the monitoring photodiode comprises an n-doped layer formed on the upper second semiconductor conducting layer in the first region, an undoped light absorption layer formed on the n-doped layer, and a p-doped layer formed on the undoped light absorption layer,
wherein the first metal electrode layer formed on the upper second semiconductor conducting layer is a cathode electrode of the monitoring photodiode and the second metal layer formed on the monitoring photodiode is an anode electrode of the monitoring photodiode.

* * * * *